(12) United States Patent
Honjo et al.

(10) Patent No.: US 8,101,863 B2
(45) Date of Patent: Jan. 24, 2012

(54) PRINTED CIRCUIT BOARD

(75) Inventors: Mitsuru Honjo, Ibaraki (JP); Natsuko Yamazaki, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 1035 days.

(21) Appl. No.: 11/854,379

(22) Filed: Sep. 12, 2007

(65) Prior Publication Data

US 2008/0073109 A1    Mar. 27, 2008

(30) Foreign Application Priority Data

Sep. 26, 2006 (JP) .................................. 2006-260087

(51) Int. Cl.
*H05K 1/00* (2006.01)
(52) U.S. Cl. ...................... 174/254; 174/255; 360/245.9
(58) Field of Classification Search .................. 174/254, 174/255; 360/245.9
See application file for complete search history.

(56) References Cited

U.S. PATENT DOCUMENTS

| | | | |
|---|---|---|---|
| 3,763,306 A * | 10/1973 | Marshall ....................... | 174/115 |
| 4,149,026 A * | 4/1979 | Fritz et al. ....................... | 174/32 |
| 5,396,397 A | 3/1995 | McClanahan et al. | |
| 5,516,989 A | 5/1996 | Uedo et al. | |
| 5,666,717 A * | 9/1997 | Matsumoto et al. ....... | 29/603.12 |
| 5,708,303 A | 1/1998 | Jeng | |
| 7,319,573 B2 * | 1/2008 | Nishiyama .................. | 360/245.9 |
| 7,613,007 B2 * | 11/2009 | Amey et al. ................... | 361/763 |
| 2006/0158865 A1 | 7/2006 | Ohmi et al. | |

FOREIGN PATENT DOCUMENTS

| | | |
|---|---|---|
| JP | 06-326425 A | 11/1994 |
| JP | 07501909 A | 2/1995 |
| JP | 07074442 A | 3/1995 |
| JP | 07-312469 A | 11/1995 |
| JP | 10158472 A | 6/1998 |
| JP | 2000340904 A | 12/2000 |
| JP | 2001-024339 A | 1/2001 |
| JP | 2001077542 A | 3/2001 |
| JP | 2002009416 A | 1/2002 |
| JP | 2002188031 A | 7/2002 |
| JP | 2002-261450 A | 9/2002 |
| JP | 2003327827 A | 11/2003 |
| JP | 2004-87627 A | 3/2004 |
| JP | 2005-011387 A | 1/2005 |
| JP | 2005-015652 A | 1/2005 |
| JP | 2005-244004 A | 9/2005 |
| JP | 2006-041044 A | 2/2006 |
| JP | 2006060112 A | 3/2006 |
| JP | 2006-104302 A | 4/2006 |
| JP | 2007180219 A | 7/2007 |

OTHER PUBLICATIONS

Office Action issued Jun. 7, 2011 in JP Application No. 2006-260087 (English Translation).

* cited by examiner

*Primary Examiner* — Ishwarbhai Patel
(74) *Attorney, Agent, or Firm* — Panitch Schwarze Belisario & Nadel LLP

(57) ABSTRACT

A plurality of wiring patterns are formed on a first surface of a base insulating layer, and a ground layer is formed on a second surface opposite to the first surface. A cover insulating layer is then formed on the first surface of the base insulating layer so as to cover the plurality of wiring patterns. Further, a cover insulating layer is formed on the second surface of the base insulating layer so as to cover the ground layer. A high dielectric insulating layer having a dielectric constant of 10 to 30, for example, is then formed on the cover insulating layer.

8 Claims, 3 Drawing Sheets

PRINTED CIRCUIT BOARD

BACKGROUND OF THE INVENTION

1. Field of the Invention

The present invention relates to a printed circuit board used for various types of electric equipment or electronic equipment.

2. Description of the Background Art

Conventionally, printed circuit boards have been used for various types of electric equipment or electronic equipment. In order to make the electric equipment and the electronic equipment small in size and lightweight, wiring patterns on the printed circuit boards have been made higher in density, and have been placed on the printed circuit boards miniaturized and increased in density.

In recent years, the increase in density of the wiring circuit boards has progressed, as described above, and signals to be handled have been becoming high-frequency digital signals. As a result, crosstalk of the digital signals to adjacent wiring patterns or radiative noise may occur.

Therefore, a method of inhibiting the crosstalk and the radiative noise from occurring by respectively forming conductive films on both surfaces of an insulator in a printed circuit board is proposed (see JP 2004-87627 A).

In the above-mentioned conventional printed circuit board, however, a coupling capacitance increases between a wiring pattern and the conductive films formed on the insulator increases. As a result, a characteristic impedance is significantly reduced, so that the transmission efficiency of a digital signal is reduced.

SUMMARY OF THE INVENTION

An object of the present invention is to provide a printed circuit board capable of inhibiting a characteristic impedance from being reduced while inhibiting crosstalk and radiative noise from occurring.

A printed circuit board according to an aspect of the present invention includes a base insulating layer having a first surface and a second surface, a conductor pattern formed on the first surface of the base insulating layer, a protective layer formed on the first surface of the base insulating layer so as to cover the conductor pattern, a ground layer formed on the second surface of the base insulating layer, and a high dielectric insulating layer formed on the protective layer and having a dielectric constant of not less than 10 nor more than 30.

In the printed circuit board, the conductor pattern is formed on the first surface of the base insulating layer. The protective layer is formed on the first surface of the base insulating layer so as to cover the conductor pattern. On the other hand, the ground layer is formed on the second surface of the base insulating layer. The high dielectric insulating layer having a dielectric constant of not less than 10 nor more than 30 is formed on the protective layer.

Such a configuration makes it possible to inhibit a characteristic impedance from being reduced while inhibiting crosstalk of a digital signal to an adjacent conductor pattern and radiative noise from occurring. Consequently, the transmission efficiency of the digital signal can be prevented from being reduced.

The high dielectric insulating layer may include resin and a high dielectric substance. In this case, the insulating layer having a high dielectric constant can be easily produced.

The high dielectric insulating layer may be formed by dispersing the high dielectric substance in the resin.

In this case, the dielectric constant of the high dielectric insulating layer can be controlled depending on the amount of the high dielectric substance dispersed in the resin.

The high dielectric substance may include barium titanate. In this case, the cost of the high dielectric substance can be reduced by using barium titanate.

The resin may include polyimide resin or epoxy resin. The base insulating layer may include polyimide resin, epoxy resin, acrylic resin, or butyral resin. The protective layer may include epoxy resin.

The conductor pattern may include a wiring pattern for digital signal transmission. In this case, even when the digital signal is transmitted by the wiring pattern, it is possible to inhibit the characteristic impedance from being reduced while reliably inhibiting crosstalk of the digital signal to an adjacent wiring pattern and radiative noise from occurring. Therefore, the transmission efficiency of the digital signal can be reliably prevented from being reduced.

Other features, elements, characteristics, and advantages of the present invention will become more apparent from the following description of preferred embodiments of the present invention with reference to the attached drawings.

DESCRIPTION OF THE PREFERRED EMBODIMENTS

Figure 1:
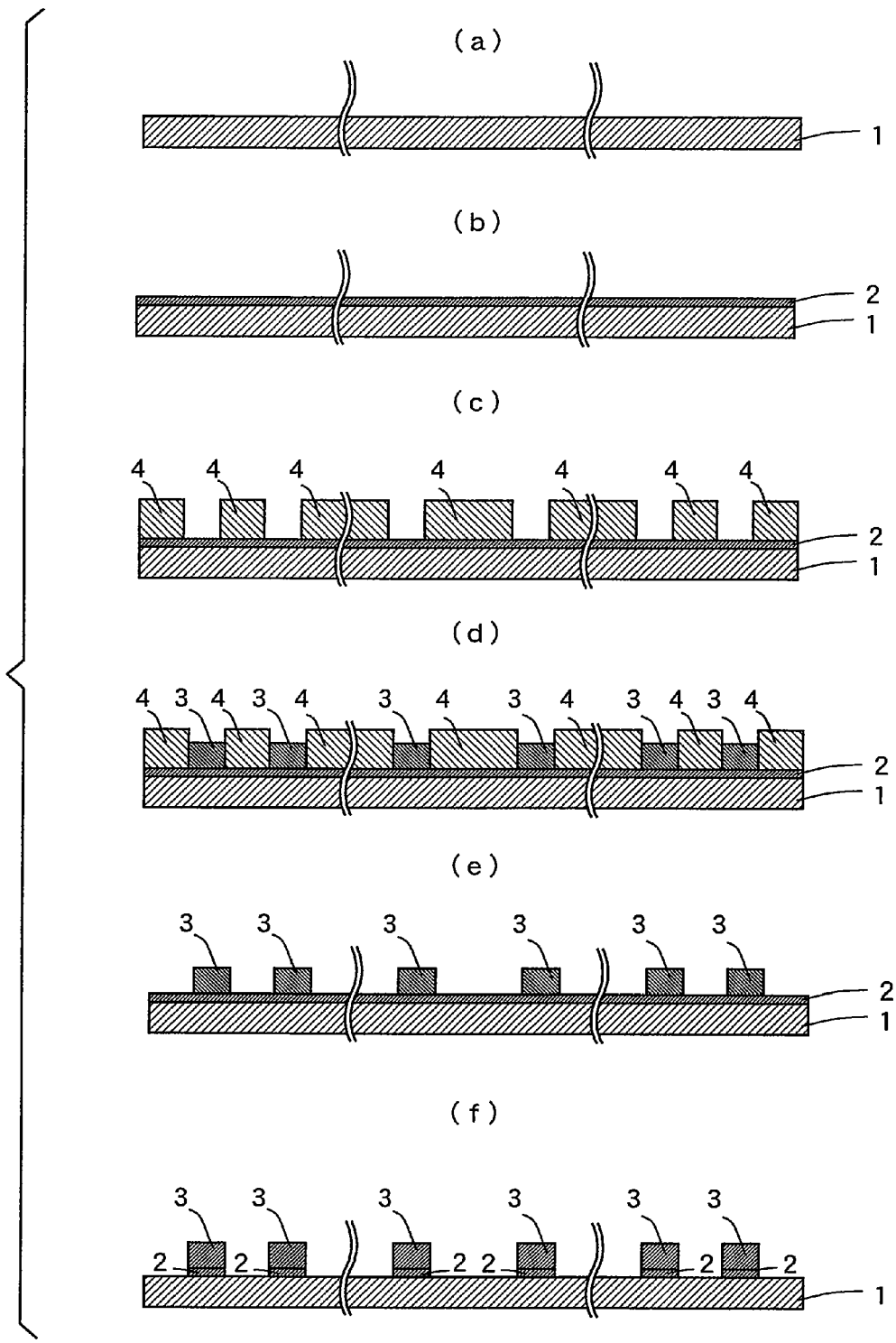
FIG. 1 is schematic sectional views showing an example of a method of forming wiring patterns by a semi-additive method.

A printed circuit board according to an embodiment of the present invention will be now described while referring to the drawings. The printed circuit board according to the embodiment is a flexible printed circuit board.

(1) Method of Forming Wiring Patterns

An example of a method of forming wiring patterns is a general semi-additive method.

FIG. 1 is schematic sectional views showing an example of a method of forming wiring patterns by a semi-additive method.

As shown in FIG. 1 (a), a base insulating layer 1 composed of a polyimide film, for example, is prepared. Note that a base insulating layer 1 composed of epoxy resin, acrylic resin, or butyral resin may be used. Further, the dielectric constant of the base insulating layer 1 is approximately 3.2 to 4.0, for example.

As shown in FIG. 1 (b), a metal thin film 2 is then formed on the base insulating layer 1 by sputtering or electroless plating. The metal thin film 2 is a laminated film including a layer composed of nickel (Ni) and chromium (Cr) and a layer composed of copper (Cu), for example.

Then, as shown in FIG. 1 (c), a plating resist 4 having a pattern opposite to wiring patterns, described later, formed in the subsequent steps is formed using a dry film resist or the like on the metal thin film 2.

Thereafter, as shown in FIG. 1 (d), wiring patterns 3 are formed by electrolytic copper plating on areas, on which the plating resist 4 is not formed, of the metal thin film 2.

Then, as shown in FIG. 1 (e), the plating resist 4 is removed by peeling or the like.

Then, as shown in FIG. 1 (f), the layer composed of copper, excluding areas below the wiring patterns 3, in the metal thin film 2 is removed by chemical etching. Usable as an ethant for the chemical etching is a liquid mixture of hydrogen peroxide and sulfuric acid.

Thereafter, the layer composed of nickel and chromium, excluding the areas below the wiring patterns 3, in the metal thin film 2 is removed by chemical etching. Usable as an ethant for the chemical etching is a liquid mixture of hydrochloric acid and sulfuric acid.

As described in the foregoing, a plurality of wiring patterns 3 are formed on the base insulating layer 1 by the semi-additive method. In the present embodiment, each of the wiring patterns 3 transmits a high-frequency digital signal.

(2) Steps after Forming Wiring Patterns

Description is then made of steps after forming the plurality of wiring patterns 3 on the base insulating layer 1 by the semi-additive method in the present embodiment.

Figure 2:
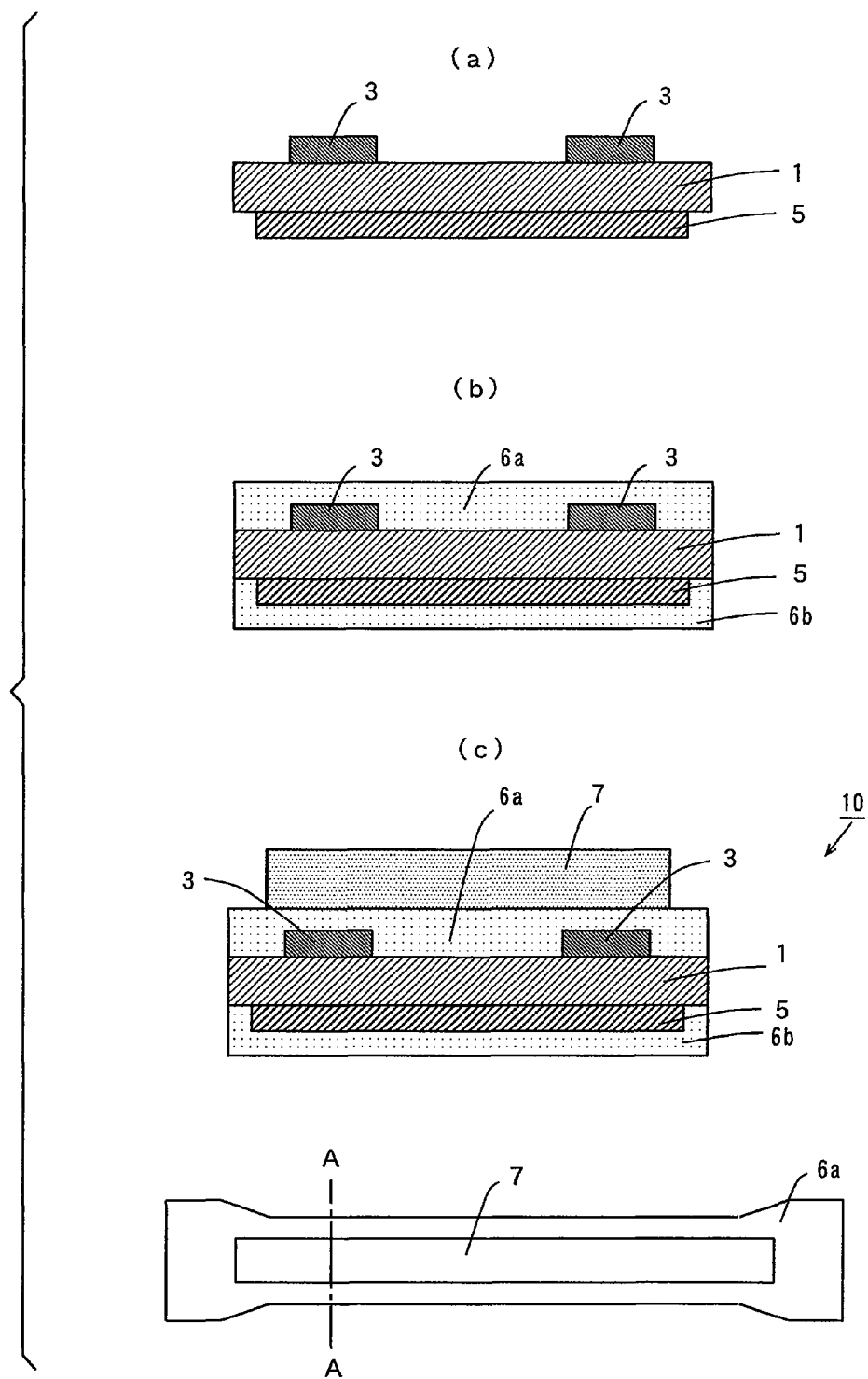
FIG. 2 is schematic sectional views showing steps after forming a plurality of wiring patterns in accordance with insulating layer.
Figure 3:
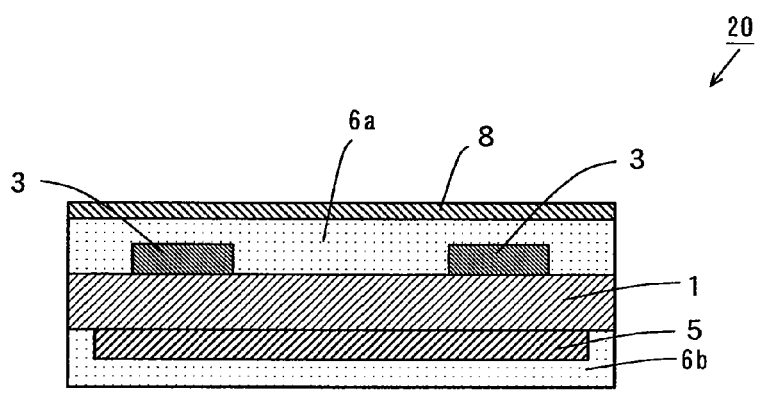
FIG. 3 is a schematic sectional view showing the configuration of a printed circuit board in a comparative example.

FIG. 2 is schematic sectional views showing the steps after forming the plurality of wiring patterns 3 on the base insulating layer 1. In FIG. 2 and FIG. 3, described later, the illustration of the metal thin film 2 formed between the base insulating layer 1 and the wiring patterns 3 is omitted. An upper portion of FIG. 2 (c) shows a cross-sectional view taken along a line A-A in a top view of the printed circuit board 10 shown in a lower portion of FIG. 2 (c).

As shown in FIG. 2 (a), a ground layer 5 composed of copper, for example, is formed on a surface (hereinafter referred to as a second surface) opposite to a surface (hereinafter referred to as a first surface) of the base insulating layer 1 having the plurality of wiring patterns 3 formed thereon.

Then, as shown in FIG. 2 (b), a cover insulating layer 6a composed of resin including epoxy, for example, is formed on the first surface of the base insulating layer 1 so as to cover the plurality of wiring patterns 3. A cover insulating layer 6b composed of resin including epoxy, for example, is formed on the second surface of the base insulating layer 1 so as to cover the ground layer 5. The dielectric constant of the cover insulating layers 6a and 6b is approximately 3.2 to 4.0, for example.

Then, as shown in the upper portion of FIG. 2 (c), a high dielectric insulating layer 7 having a dielectric constant of 10 to 30, for example, is formed on the cover insulating layer 6a. This causes a printed circuit board 10 according to the present embodiment to be completed.

The high dielectric insulating layer 7 is obtained by dispersing a high dielectric substance such as barium titanate in resin composed of polyimide or epoxy, for example. The dielectric constant of the high dielectric insulating layer 7 can be controlled depending on the amount of the high dielectric substance dispersed in the resin.

Furthermore, the thickness of the high dielectric insulating layer 7 is preferably 10 to 50 μm and more preferably 15 to 30 μm.

It is preferable that the width of the high dielectric insulating layer 7 is set to such a value that the high dielectric insulating layer 7 covers an area from the wiring pattern 3 formed at a position closest to one of the sides of the first surface of the base insulating layer 1 to the wiring pattern 3 formed at a position closest to the other side of the first surface. Further, it is preferable that the length of the high dielectric insulating layer 7 is set to a value larger than the length of each of the wiring patterns 3.

Usable as a method of forming the high dielectric insulating layer 7 is a screen printing method, an exposure/development process method, or a coating formation method using a dispenser.

(3) Effect of the Present Embodiment

In the present embodiment, therefore, the high dielectric insulating layer 7 is formed on the cover insulating layer 6a formed so as to cover the wiring patterns 3, which makes it possible to inhibit a characteristic impedance from being reduced while inhibiting crosstalk of a digital signal to the adjacent wiring pattern 3 and radiative noise from occurring.

(4) Another Embodiment

A material for the base insulating layer 1 is not limited to that in the above-mentioned example. For example, another insulating material such as polyethylene terephthalate, polyether nitrile, or polyether sulphone may be used.

A material for the wiring pattern 3 is not limited to copper. For example, another metal material such as a copper alloy, gold, or aluminum may be used.

A material for the ground layer 5 is not limited to copper. For example, another metal material such as a copper alloy, gold, or aluminum may be used.

A material for the cover insulating films 6a and 6b is not limited to that in the above-mentioned example. For example, another insulating material such as polyethylene terephthalate, polyether nitrile, or polyether sulphone may be used.

The high dielectric substance composing the high dielectric insulating layer 7 is not limited to barium titanate. For example, another high dielectric substance, such as another titanate such as lead titanate, zirconate such as barium zirconate, or lead zirconate titanate (PZT), may be used. The high dielectric insulating layer 7 may be formed of a mixture of a high dielectric substance and resin, or may be formed of only a high dielectric substance.

(5) Correspondences Between Elements in the Claims and Parts in Embodiments

In the following paragraph, non-limiting examples of correspondences between various elements recited in the claims below and those described above with respect to various embodiments of the present invention are explained.

In the embodiments described above, the wiring patterns 3 are an example of a conductor pattern, the cover insulating layer 6a is an example of a protective layer, and the ground layer 5 is an example of a ground layer.

As each of various elements recited in the claims, various other elements having configurations or functions described in the claims can be also used.

EXAMPLES

An inventive example and a comparative example in the present invention will be now described.

(a) Inventive Example

In the inventive example, a printed circuit board 10 was manufactured in accordance with the above-mentioned embodiment. The details of the printed circuit board 10 in the inventive example are as follows.

A high dielectric insulating layer 7 having a dielectric constant of 16 obtained by dispersing 30% by volume of barium titanate having a dielectric constant of 3300 in polyimide having a dielectric constant of 3.3 was formed on a cover insulating layer 6a by a screen printing method. The thickness of the high dielectric insulating layer 7 was set to 20 μm, and the width and the length thereof were respectively set to 10 mm and 20 mm. The value of a characteristic impedance in each wiring pattern 3 was 50Ω.

The value of the characteristic impedance was measured from an input terminal to an output terminal of a connector (not shown) by a TDR (Time Domain Reflectometry) method. As a result, the characteristic impedance was reduced by no more than 3Ω, as compared with that (50Ω) in a case where the high dielectric insulating layer 7 was not formed.

(b) Comparative Example

FIG. 3 is a schematic sectional view showing the configuration of a printed circuit board in the comparative example.

As shown in FIG. 3, the configuration of a printed circuit board 20 in the comparative example differs from the configuration of the printed circuit board 10 in the inventive example in that a silver paste layer 8 having a thickness of 10 μm was formed on a cover insulating layer 6a in place of the high dielectric insulating layer 7.

As in the inventive example, the value of a characteristic impedance was measured from an input terminal to an output terminal of a connector (not shown) by a TDR method. As a result, the characteristic impedance was reduced by 30Ω, as compared with that (50Ω) in a case where the silver paste layer 8 was not formed.

(c) EVALUATION

As can be seen from the inventive example and the comparative example, it was possible to inhibit the characteristic impedance from being reduced by forming the high dielectric insulating layer 7 on the cover insulating layer 6a.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A flexible printed circuit board comprising:
   a base insulating layer having a first surface and a second surface, the base insulating layer having a dielectric constant of not less than 3.2 and not more than 4.0;
   a plurality of conductor patterns formed on the first surface of said base insulating layer;
   a protective layer formed on the first surface of said base insulating layer so as to cover said plurality of conductor patterns, the protective layer having a dielectric constant of not less than 3.2 and not more than 4.0;
   a ground layer formed on the second surface of said base insulating layer opposite to said protective layer; and
   a high dielectric insulating layer formed on said protective layer and having a dielectric constant of not less than 10 nor more than 30,
   wherein said high dielectric insulating layer is formed on said protective layer and not on said ground layer.

2. The flexible printed circuit board according to claim 1, wherein said high dielectric insulating layer includes resin and a high dielectric substance.

3. The flexible printed circuit board according to claim 2, wherein said high dielectric insulating layer is formed by dispersing said high dielectric substance in said resin.

4. The flexible printed circuit board according to claim 2, wherein said high dielectric substance includes barium titanate.

5. The flexible printed circuit board according to claim 2, wherein said resin includes polyimide resin or epoxy resin.

6. The flexible printed circuit board according to claim 1, wherein said base insulating layer includes polyimide resin, epoxy resin, acrylic resin, or butyral resin.

7. The flexible printed circuit board according to claim 1, wherein said protective layer includes epoxy resin.

8. The flexible printed circuit board according to claim 1, wherein each of said plurality of conductor patterns includes a wiring pattern for digital signal transmission.

* * * * *